United States Patent [19]
Itoh

[11] 4,138,740
[45] Feb. 6, 1979

[54] MEMORY SYSTEM

[75] Inventor: Kiyoo Itoh, Higashi-kurume, Japan

[73] Assignee: Hitachi, Ltd., Japan

[21] Appl. No.: 886,759

[22] Filed: Mar. 15, 1978

[30] Foreign Application Priority Data

Mar. 25, 1977 [JP] Japan .................................. 52-32188

[51] Int. Cl.² ............................................ G11C 11/40
[52] U.S. Cl. .................................. 365/203; 365/205;
365/210; 307/238
[58] Field of Search ............... 365/174, 203, 207, 210,
365/205

[56] References Cited
U.S. PATENT DOCUMENTS

| 4,044,340 | 8/1977 | Itoh ....................................... 365/205 |
| 4,044,341 | 8/1977 | Stewart et al. ........................ 365/203 |
| 4,085,457 | 8/1977 | Itoh ....................................... 365/205 |

*Primary Examiner*—Terrell W. Fears
*Attorney, Agent, or Firm*—Craig & Antonelli

[57] ABSTRACT

A plurality of memory cells are connected to first and second data lines, and a circuit for applying a precharge voltage and a dummy cell are connected to each of first and second input lines which are connected to input terminal of a differential amplifier for detecting information of the memory cells. The first and second data lines are connected to the first and second input lines through first and second switching elements, respectively. When the stored signal of one memory cell connected to the first or second data line has been read out onto the first or second data line, the dummy cell connected to the second or first input line is read out selectively, with the result that a voltage of the second or first input line is set to the intermediate value of two different voltages, either of which the first or second input line could take after reading out the stored signal.

21 Claims, 8 Drawing Figures

MEMORY SYSTEM

LIST OF PRIOR ART (37 CFR 1.56(a))

The following references are cited to show the state of the art:

P. R. Schroeder et al, ISSCC Digest of Technical Papers, p 12, 13; Feb., 1977,

Japanese Published Unexamined Patent Application, Publication No. 50-40246, Apr. 12, 1975, which claims priority on U.S. patent application Ser. No. 385,484, now abandoned, Japanese Published Unexamined Patent Application, Publication No. 51-113545, Oct. 6, 1976, on which U.S. patent application Ser. No. 672,154 now U.S. Pat. No. 4,085,457 claims priority, U.S. Pat. No. 4,044,340.

BACKGROUND OF THE INVENTION

This invention relates to a memory system, and more particularly to a random access memory system. More concretely, it relates to a semiconductor memory system which is formed on a large-scale integrated circuit comprised of MOSFET's. More specifically, it relates to a memory system with a memory sense circuit which detects stored signals of memory cells utilizing one-transistor cells at higher speed and at higher sensitivity.

In a semiconductor memory utilizing one-transistor cells, a signal read out from a memory cell is very small. In order to realize a high-speed random access memory, accordingly, it is important to detect the small signal at high speed. A technique for the high-speed detection is described in a co-pending U.S. patent application Ser. No. 644,855, entitled "A Memory System with a Sense Circuit," filed on Mar. 31, 1976 by the same applicant, and assigned to the same assignee as those of the present application.

The memory system described in the aforecited application utilizes a pair of first and second data lines to which a plurality of memory cells are connected. Each data line has first and second data line portions, and a first flip-flop type differential amplifier which connects both the portions.

The first and second data lines are respectively connected to first and second input lines through first and second switching elements, and the first and second input lines are further connected to a second differential amplifier. After precharging the first and second input lines and the first and second data lines to a precharge voltage of approximately a half of a supply voltage in advance, one of the memory cells is read out. In this case, either a voltage signal which is higher than the precharge or a voltage signal which is lower than the same is stored in the memory cell beforehand. As a result, the potential of the data line portion with the memory cell connected thereto becomes higher or lower than the precharge voltage, depending on the stored signal of the memory cell read out. At this time, the potential of the other data line portion which pairs with the above-cited data line portion becomes lower or higher than the precharge voltage by the action of the first flip-flop type differential amplifier. After all, each data line portion becomes higher or lower than the precharge voltage according to the stored signal read out.

Accordingly, either the first or second switching element connected to this data line is rendered conductive, whereby the voltage of one of the two input lines can be shifted to a voltage higher or lower than the original precharge voltage in dependence on the signal read out from the memory cell. At this time, the other input line is held at the original precharge voltage. Therefore, using the original precharge voltage as a reference voltage, the difference of the voltages of the first and second input lines are amplified speedily by the second differential amplifier.

In the memory system constructed as described above, the stored signal of the memory cell can be detected at higher speed than in the past owing to the actions of the first and second flip-flop type differential amplifiers. In such a memory system, however, the operating speed of the first and second flip-flop type differential amplifiers is not satisfactorily high yet. In the foregoing memory system, by the differential amplifiers, the voltage of one of the pair of data lines and the voltage of one of the pair of input lines are raised so as to become higher than the original precharge voltage, and the voltage of the other is lowered so as to become lower than the original precharge voltage. The flip-flop type differential amplifier however requires a longer time for raising the output voltage than for lowering it. Accordingly, supposing now the first case where the first signal with a higher voltage is read out from a memory cell and the corresponding switching element is turned "on" when a certain time has lapsed after starting the amplification of the first signal by the first differential amplifier, and the second case where the second signal with a lower voltage is read out from the memory cell and the corresponding switching element is turned "on" when the same time has lapsed after starting the amplification of the second signal by the first differential amplifier, the difference between the voltage of the input line onto which the first signal is read out and the precharge voltage on the other input line is smaller than the difference between the voltage of the input line onto which the second signal is read out and the precharge voltage on the other input line. Consequently, the precharge voltage which is one of the two input signals to the second differential amplifier does not lie substantially middle between the two, high and low levels which the other input signal can assume, but it is closer to the high level. Therefore, when the other input signal is at the high level, the difference between this input signal and the precharge voltage is smaller than when it is at the low level, so that the corresponding switching element must be turned "on" when a longer time has lapsed after starting the amplification by the first differential amplifier. Otherwise, the difference between the input signal of the high level and the precharge voltage cannot be made sufficiently large, and the second differential amplifier provides an erroneous output. For the reason described above, it takes a long period of time before the amplified signal of a signal stored in a memory cell is provided as an output from the second differential amplifier.

Further, for the high-speed detection, the flip-flop type differential amplifier should desirably be one which decreases the voltage of one input signal without increasing the voltage of the other input signal. Such a flip-flop type differential amplifier has been already known. An example is constructed of a pair of cross-connected transistors, no load transistor being connected to the transistors, and it is called the dynamic flip-flop. In employing the dynamic flip-flops as the first and second differential amplifiers described before, it is desirable to make the precharge voltage of the data lines and the input lines a supply voltage or a voltage of close thereto. For securing the amplification by the first amplifier, either of two voltages lowered by different values from the precharge voltage in is stored into each memory cell. Accordingly, when the first data line is coupled with the first input line after reading out the memory cell connected to the first data line, the voltage of the first input line becomes lower than the original precharge voltage at all times irrespective of the stored signal of the memory cell. Consequently, the other or second input line onto which the stored signal of the memory cell is not read out and which is held at the precharge voltage is always higher in voltage than the first input line onto which the stored signal of the memory cell has been read out. For this reason, the second differential amplifier does not provides a signal corresponding to the stored signal of the memory cell. Accordingly, the dynamic flip-flop cannot be used as the second differential amplifier, with the result that the high-speed operation cannot be achieved.

SUMMARY OF THE INVENTION

An object of this invention is to provide a memory system which can detect stored signals of memory cells at higher speed.

Another object of this invention is to provide a memory system in which, when an input line connected to a differential amplifier has received either of first and second signals of different levels lower than a precharge level of the input line, the received input signal can be detected at high speed.

Still another object of this invention is to provide a memory system in which, when an input line connected to a differential amplifier has received either of a first signal of a level higher than a precharge level of the input line and a second signal of a level lower than the precharge level of the input line, the differences of the levels of the first and second signals from the precharge level having different absolute values, the received input signal can be detected at high speed.

A memory system according to this invention is characterized in that precharge means and dummy cell means are connected to each of a pair of first and second input line means, which is further connected to differential detection means. The pair of input line means are precharged to a predetermined voltage by the precharge means, whereupon the dummy cell means connected to one of the two input line means is read out to shift the voltage of this input line means by a predetermined value from the precharge voltage. Each dummy cell means is constructed so that a voltage of one input line after the shift may become a value intermediate between two voltages which the other input line means may take when two different signals from memory cells have been impressed on it.

DETAILED DESCRIPTION OF THE PREFERRED EMBODIMENTS

Figure 1:
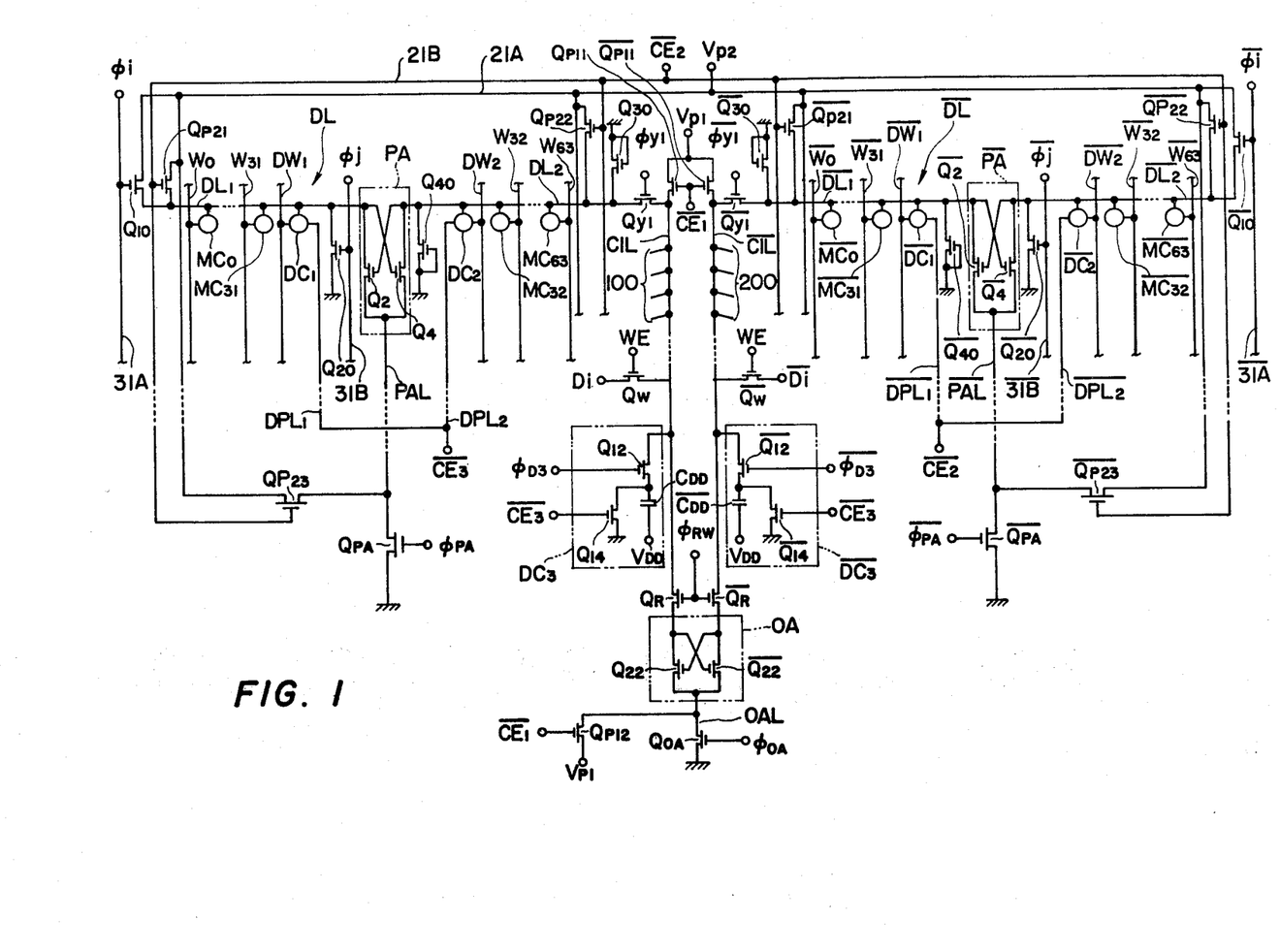
FIG. 1 is a schematic circuit diagram of a memory system according to this invention.

Referring to FIG. 1, a first data line DL has first and second data line portions $DL_1$ and $DL_2$, and a pre-amplifier PA comprised of a dynamic flip-flop whose input nodes are connected to the data line portions. Likewise, a second data line $\overline{DL}$ has first and second data line portions $\overline{DL_1}$ and $\overline{DL_2}$, and a pre-amplifier $\overline{PA}$ comprised of a dynamic flip-flop whose input nodes are connected to the data line parts.

The data line portions $DL_1$ and $DL_2$ or $\overline{DL_1}$ and $\overline{DL_2}$ are formed of the same geometry.

In a manner to intersect with the data line portions $DL_1$, $DL_2$, $\overline{DL_1}$, and $\overline{DL_2}$, there are respectively disposed a plurality of word lines $W_0$–$W_{31}$ as well as a dummy word line $DW_1$, a plurality of word lines $W_{32}$–$W_{63}$ as well as a dummy word line $DW_2$, a plurality of word lines $\overline{W_0}$–$\overline{W_{31}}$ as well as a dummy word line $\overline{DW_1}$, and a plurality of word lines $\overline{W_{32}}$–$\overline{W_{63}}$ as well as a dummy word line $\overline{DW_2}$. For the sake of simplicity, the word lines $W_1$–$W_{30}$, $W_{33}$–$W_{62}$, $\overline{W_1}$–$\overline{W_{30}}$, and $\overline{W_{33}}$–$\overline{W_{62}}$ are omitted from the drawing. At the points of intersection of the first data line DL and the word lines $W_0$–$W_{63}$, memory cells $MC_0$–$MC_{63}$ are respectively disposed so as to be connected to these data line and word lines. Similarly, memory cells $\overline{MC_0}$–$\overline{MC_{63}}$ are connected at the points of intersection between the second data line $\overline{DL}$ and the word lines $\overline{W_0}$–$\overline{W_{63}}$. For the sake of simplicity, the memory cells $MC_1$–$MC_{30}$, $MC_{33}$–$MC_{62}$, $\overline{MC_1}$–$\overline{MC_{30}}$, and $\overline{MC_{33}}$–$\overline{MC_{62}}$ are not shown in the drawing.

Further, at the points of intersection of the data line portions $DL_1$, $DL_2$, $\overline{DL_1}$, and $\overline{DL_2}$ and the dummy word lines $DW_1$, $DW_2$, $\overline{DW_1}$, and $\overline{DW_2}$, dummy cells $DC_1$, $DC_2$, $\overline{DC_1}$, and $\overline{DC_2}$ are respectively disposed so as to be connected to the corresponding data line portions and dummy word lines. A precharge signal $\overline{CE_3}$ is applied to the respective dummy cells through respective dummy precharge lines $DPL_1$, $DPL_2$, $\overline{DPL_1}$, and $\overline{DPL_2}$.

The drains of MOSFET's $Q_{p21}$, $Q_{p22}$, $\overline{Q_{p21}}$, and $\overline{Q_{p22}}$ connected to the respective data line parts $DL_1$, $DL_2$, $\overline{DL_1}$, and $\overline{DL_2}$ are supplied with a voltage $V_{p2}$ by a line 21A. The voltage $V_{p2}$ is equal to a voltage $V_{DD}$ (10 volts). The gates of these four MOSFET's are supplied with a precharge signal $\overline{CE_2}$ by a line 21B. When this precharge signal has become a level (14 volts) sufficiently higher than the voltage $V_{DD}$, the four MOSFET's precharge the corresponding data line portions $DL_1$, $DL_2$, $\overline{DL_1}$, and $\overline{DL_2}$ to the voltage $V_{DD}$. At this time, latch lines PAL and $\overline{PAL}$ respectively connected to the latch nodes of the pre-amplifiers PA and $\overline{PA}$ are precharged to the same precharge voltage $V_{DD}$ by MOSFET's $Q_{p23}$ and $\overline{Q_{p23}}$ whose drains have the voltage $V_{p2}$ applied thereto and whose gates have the precharge signal $\overline{CE_2}$ applied thereto. At the time of precharge, accordingly, MOSFET's $Q_2$ and $Q_4$ and MOSFET's $\overline{Q_2}$ and $\overline{Q_4}$ constituting the respective pre-amplifiers PA and $\overline{PA}$ are "off," and neither pre-amplifier effects amplification.

Figure 2:
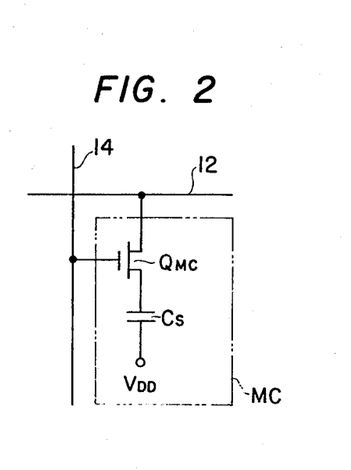
FIG. 2 is a schematic circuit diagram which shows a memory cell for use in this invention, connected to a word line as well as a data line.

As shown in FIG. 2, the memory cell for use in this invention is comprised of a series connection of a MOSFET $Q_{MC}$ and a capacitor $C_S$ interposed between one data line 12 and the voltage $V_{DD}$, the gate of the MOSFET $Q_{MC}$ being connected to one word line 14. In case of storing a signal, under the condition that the voltage of the word line 14 is a high voltage, the voltage of the data line 12 is stored into the capacitor $C_S$. In case of reading out a signal, under the condition that the voltage of the word line 14 is a high voltage, the voltage signal stored in the capacitor $C_S$ is transferred to the data line 12, and different voltage signals are generated on the data line 12. As will be stated later, in storing a signal, the potential of the data line is set at either a value somewhat lower than the voltage $V_{DD}$ or the zero volt. Accordingly, either the value somewhat lower than the voltage $V_{DD}$ or the zero volt is stored into the capacitor of the memory cell. In reading out a signal, accordingly, the voltage of the data line portion with which the memory cell to be read out is connected shifts from the precharge voltage $V_{DD}$ to either a voltage somewhat lower than $V_{DD}$ or a still lower voltage.

Figure 3:
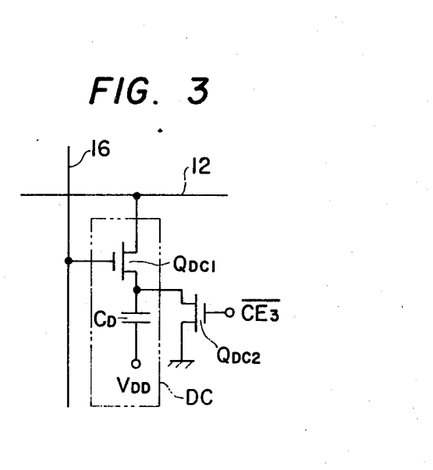
FIG. 3 is a schematic circuit diagram which shows a dummy cell for use in this invention, connected to a dummy word line as well as a data line.

As shown in FIG. 3, each of the dummy cells $DC_1$, $DC_2$, $\overline{DC_1}$, and $\overline{DC_2}$ is constructed of a series connection of a MOSFET $Q_{DC1}$ and a capacitor $C_D$ interposed between one data line 12 and the voltage $V_{DD}$, and a MOSFET $Q_{DC2}$ connected in parallel with the capacitor $C_D$. The source of the MOSFET $Q_{DC2}$ is connected to the zero volt and the gate has the precharge signal $\overline{CE_3}$ applied thereto. The MOSFET $Q_{DC2}$ provides the zero volt on the capacitor $C_D$ at the time of precharge. The gate of the MOSFET $Q_{DC1}$ is connected to a dummy word line 16. When the voltage of this dummy word line has become a high voltage, the voltage of the data line 12 lowers from the original precharge voltage down to a predetermined reference voltage. The reference voltage is made substantially equal to the middle value of two voltages which the data line portion can take when a signal has been read out from a particular memory cell. To this end, the capacitance of the capacitor $C_D$ of the dummy cell is selected to approximately a half of the capacitance of the capacitor $C_S$ of the memory cell.

When a signal is read out from a memory cell connected to the first data line portion $DL_1$ or $\overline{DL_1}$, the dummy cell $DC_2$ or $\overline{DC_2}$ is simultaneously read out, respectively. When a signal is read out from a memory cell connected to the second data line part $DL_2$ or $\overline{DL_2}$, the dummy cell $DC_1$ or $\overline{DC_1}$ is simultaneously read out, respectively. Immediately thereafter, in order to amplify the signal read out from the memory cell, the potential of the latch line PAL or $\overline{PAL}$ of the preamplifier PA or $\overline{PA}$ is lowered by turning "on" a MOSFET $Q_{PA}$ or $\overline{Q_{PA}}$ connected to the latch line by changing a signal $\phi_{PA}$ or $\overline{\phi_{PA}}$ on the gate thereof to high and the pre-amplifier PA or $\overline{PA}$ is thus brought into the amplifying state. By the action of the pre-amplifier, the difference between the voltage of the data line portion with which the memory cell to be read out is connected, and the voltage of the data line portion pairing with the former data line portion is amplified. Accordingly, no matter which the stored signal may be, the voltages of the first and second data line portions change according to the stored signal read out. The voltage of the data line portion $DL_2$ can be regarded as an amplified signal of the read out signal. Of course, while the stored signal of the memory cell connected to the first data line DL is being read out, neither any memory cell nor any dummy cell connected to the second data line $\overline{DL}$ is read out, and accordingly, the voltage of the second data line $\overline{DL}$ remains the original precharge voltage $V_{DD}$.

The first and second data lines DL and $\overline{DL}$ are respectively connected to first and second common input lines CIL and $\overline{CIL}$ by MOSFET's $Q_{y1}$ and $\overline{Q_{y1}}$. The common input lines CIL and $\overline{CIL}$ receive the amplified signals of the stored signals and provide them to a main amplifier OA. As diagrammatically illustrated at numerals 100 and 200, further pluralities of data lines are respectively connected to the common input lines CIL and $\overline{CIL}$ through MOSFET's (not shown). MOSFET's $Q_R$ and $\overline{Q_R}$ are interposed in the common input lines CIL and $\overline{CIL}$, respectively. These MOSFET's are held in the "on" state by a high voltage (14 volts) applied to the gates thereof except when a signal is to be written into a memory cell. A voltage $V_{p1}$ (selected to be equal to the voltage $V_{DD}$) is applied to the drains of MOSFET's $Q_{p11}$ and $\overline{Q_{p11}}$, and a precharge signal $CE_1$ to the gates thereof. When the precharge signal $CE_1$ has become a sufficiently high voltage (for example, 14 volts), the MOSFET's $Q_{p11}$ and $\overline{Q_{p11}}$ precharge the common input lines CIL and $\overline{CIL}$ to the voltage $V_{DD}$, respectively. Dummy cells $DC_3$ and $\overline{DC_3}$ featuring this invention are connected to the common input lines CIL and $\overline{CIL}$, respectively. By way of example, in case of reading out the stored signal of the memory cell $MC_{63}$, the stored signals of the memory cell $MC_{63}$ and the dummy cell $DC_1$ are respectively read out onto the data line portions $DL_2$ and $DL_1$, the difference between the voltages of the data line portions is amplified by the preamplifier PA, and thereafter, a signal $\phi_{y1}$ is changed to a high voltage ($V_{DD}$) to turn the MOSFET $Q_{y1}$ "on." As a result, the voltage of the common input line CIL changes from the precharge voltage $V_{DD}$ to a voltage corresponding to the voltage of the data line portion $DL_2$ at that time. The voltage after the change can become two different values in correspondence with the stored signal of the memory cell $MC_{63}$. The dummy cell $\overline{DC_3}$ serves to change the voltage of the common input line $\overline{CIL}$ so as to lie substantially middle between the two different voltages which the common input line CIL can assume. The dummy cell $\overline{DC_3}$ is composed of a series connection of a MOSFET $\overline{Q_{12}}$ and a capacitor $\overline{C_{DD}}$ interposed between the common input line $\overline{CIL}$ and the voltage $V_{DD}$, and a MOSFET $\overline{Q_{14}}$ connected in parallel with the capacitor $\overline{C_{DD}}$. The source of the MOSFET $\overline{Q_{14}}$ is connected to the earth, and the precharge signal $\overline{CE_3}$ is impressed on the gate thereof. When the precharge signal $\overline{CE_3}$ has become the high voltage $V_{DD}$ volts, the zero volt is applied to the capacitor $\overline{C_{DD}}$. Accordingly, when a signal $\overline{\phi_{D3}}$ has become the high level $V_{DD}$ volts, the voltage of the common input line $\overline{CIL}$ shifts from the original precharge voltage $V_{DD}$ down to substantially the middle value of the two voltages which the common input line $\overline{CIL}$ can take. In order to ensure this voltage shift, the capacitance of the capacitor $\overline{C_{DD}}$ is properly determined by experiment. By way of example, when the capacitances of the first and second data line portions are $C_O$, the capacitances of the common input lines CIL and $\overline{CIL}$ are about 10 $C_O$ and the capacitance of the memory cell is 1/10 $C_O$, respectively, the capacitances of the dummy cells $DC_3$ and $\overline{DC_3}$ are selected to be equal to about $C_O$.

The dummy cell $DC_3$ has quite the same structure as that of the dummy cell $\overline{DC_3}$. The dummy cell $DC_3$, however, differs from the dummy cell $\overline{DC_3}$ in that it is connected to the common input line CIL by a signal $\phi_{D3}$ when the memory cell connected to the data line $\overline{DL}$ is read out.

The common input lines CIL and $\overline{CIL}$ are respectively connected with a pair of input nodes of the output amplifier OA comprised of a flip-flop. The output amplifier OA changes the voltages of the common input lines CIL and $\overline{CIL}$ so as to amplify the difference between the voltages of the common input lines CIL and $\overline{CIL}$, thereby to assure that the voltage difference of the common input lines CIL and $\overline{CIL}$ is detected.

The main amplifier OA consists of a pair of cross-connected MOSFET's $Q_{22}$ and $\overline{Q_{22}}$, and its latch line OAL has a MOSFET $Q_{p12}$ connected thereto. The High voltage $V_{p1}$ (equal to $V_{DD}$) is applied to the drain of the MOSFET $Q_{p12}$, and the precharge signal $\overline{CE_1}$ to the gate thereof. When the precharge signal $\overline{CE_1}$ has become the high level (14 volts), the latch line OAL is precharged to the voltage $V_{DD}$. Under this state, both the MOSFET's $Q_{22}$ and $\overline{Q_{22}}$ are "off," and the main amplifier OA does not effect amplification. When a MOSFET $Q_{OA}$ connected to the latch line OAL is turned "on" by a signal $\phi_{OA}$, the latch line OAL has the voltage lowered rapidly and changes from the non-amplifying state till then to the amplifying state. As a result, the voltage difference of the common input lines CIL and $\overline{CIL}$ is amplified, and the amplified voltage difference of these common input lines becomes utilizable in an external circuit.

MOSFET's $Q_{10}$ and $Q_{20}$ and MOSFET's $\overline{Q_{10}}$ and $\overline{Q_{20}}$ which are respectively connected to the data line portion $DL_1$ and the data line portion $\overline{DL_2}$ serve to write new signals into the respective memory cells. MOSFET's $Q_{30}$ and $Q_{40}$ and MOSFET's $\overline{Q_{30}}$ and $\overline{Q_{40}}$ which are respectively connected to the data line part $DL_2$ and $\overline{DL_1}$ are dummy MOSFET's for making the capacitances of the data line portions $DL_1$ and $DL_2$ and those of the data line portions $\overline{DL_1}$ and $\overline{Dl_2}$ substantially equal, respectively. The MOSFET's $Q_{10}$, $Q_{20}$, $\overline{Q_{10}}$ and $\overline{Q_{20}}$ are also disposed for the other data lines indicated by 100 and 200. The MOSFET's $Q_{10}$, $Q_{20}$, $\overline{Q_{10}}$ and $\overline{Q_{20}}$ on the data lines DL and $\overline{DL}$, and the corresponding MOSFET's on the other data lines are driven in common by signals $\phi_i$, $\phi_j$, $\overline{\phi_i}$ and $\overline{\phi_j}$ on signal lines 31A, 31B, 31A and 31B, respectively. A method of writing signals into the respective memory cells by the use of these MOSFET's is described in a co-pending U.S. patent application Ser. No. 831,138, entitled "Semiconductor Memory" filed on Sept. 7, 1977 by the same applicant, and assigned to the same assignee as those of the present application. The contents of the specification of the co-pending application shall be included in this specification by citing it herein.

The operation of the memory system will be explained with reference to FIG. 4. During the period during which neither "read" from the memory cell nor "write" into the memory cell is executed, that is, during the precharge period, no signal is applied to the word lines $W_0$–$W_{63}$, $\overline{W_0}$–$\overline{W_{63}}$, $DW_1$, $DW_2$, $\overline{DW_1}$ and $\overline{DW_2}$. The signals $\phi_{PA}$, $\phi_{OA}$, $\phi_{y1}$ and $\overline{\phi_{y1}}$ which control the gating of the MOSFET's $Q_{PA}$, $Q_{OA}$, $Q_{y1}$ and $\overline{Q_{y1}}$ respectively are held at the low level (zero volt) as indicated at 204a, 210a and 206a respectively. Similarly, the signal $\overline{\phi_{PA}}$ which controls the gating of the MOSFET $\overline{Q_{PA}}$ is held at the low level (zero volt). Accordingly, all the MOSFET's $Q_{PA}$, $\overline{Q_{PA}}$, $Q_{OA}$, $Q_{y1}$ and $\overline{Q_{y1}}$ are in the "off" state. A signal $\phi_{RW}$ which controls the gating of the MOSFET's $Q_R$ and $\overline{Q_R}$ is at the high level (14 volts).

On the other hand, the precharge signals $\overline{CE_1}$ and $\overline{CE_2}$ are held at the high level (14 volts) as indicated at 200a, while the precharge signal $\overline{CE_3}$ is held at the high level (10 volts) as indicated at 201a. Accordingly, the MOSFET's $Q_{P21}$, $Q_{P22}$, $\overline{Q_{P21}}$, $\overline{Q_{P22}}$, $Q_{P11}$, $\overline{Q_{P11}}$, $Q_{P23}$, $\overline{Q_{P23}}$ and $Q_{P12}$ are in the "on" state. As a result, all the data line portions $DL_1$, $DL_2$, $\overline{DL_1}$ and $\overline{DL_2}$, the common input lines CIL, $\overline{CIL}$ and the latch lines PAL, $\overline{PAL}$, OAL are all charged to the voltage $V_{DD}$ (10 volts).

Hereunder, description will be made of a case where the stored signal is read out from the memory cell $MC_{63}$ connected to the data line portion $DL_2$.

Figure 4:
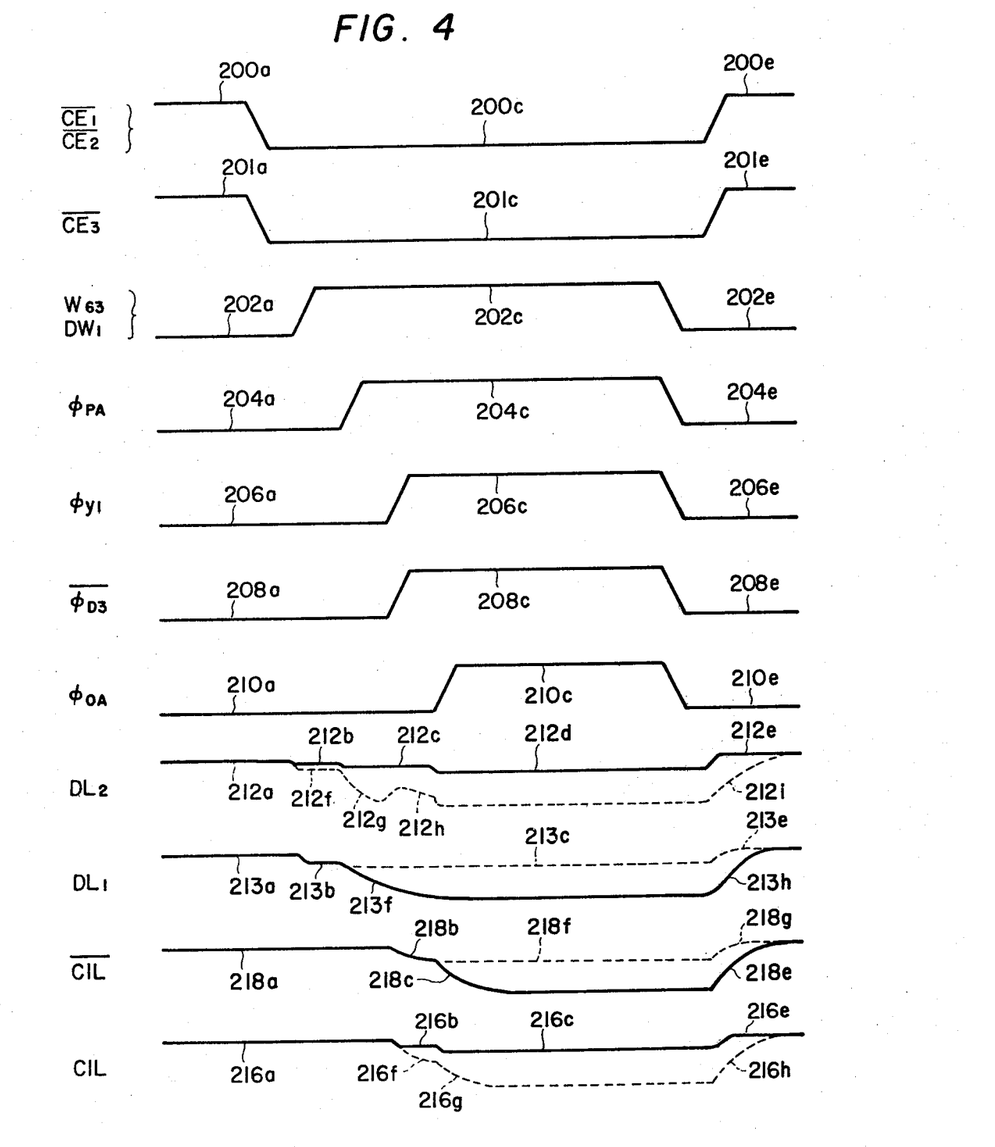
FIG. 4 is a time chart of control signals for use in the memory system of FIG. 1 and voltages of several lines in the memory system.

In FIG. 4, the voltages of the data line parts $DL_1$ and $DL_2$ and the common input lines CIL and $\overline{CIL}$ at the time when they have been precharged are denoted by 213a, 212a, 216a and 218a, respectively. Under such precharged states, all the MOSFET's which constitute the pre-amplifiers PA and $\overline{PA}$ and the main amplifier OA are "off," and these amplifiers do not effect amplification. Before reading out the stored signals from the memory cell, the precharge signals $\overline{CE_1}$ and $\overline{CE_2}$ and the precharge signal $\overline{CE_3}$ are lowered to the low level (zero volt) as shown at 200c and 201c, respectively. Thereafter, the word line $W_{63}$ and the dummy word line $DW_1$ are raised to the high level (approximately 10 volts) as indicated at 202c by means of a decoder (not shown) responsive to memory address signal. All the other word lines and dummy word lines are at the low level, so that the other memory cells and dummy cells are not connected to any of the data line portions. A high voltage (8 volts) or a low voltage (zero volt) which corresponds to logic "1" or "0" as will be described later is stored in the capacitor $C_S$ of the memory cell $MC_{63}$. Accordingly, the data line portions $DL_2$ lowers to approximately 10.0 volts indicated at 212b or approximately 9.8 volts indicated at 212f in correspondence with the logic "1" or "0" of the stored signal. The low voltage (approximately zero volt) is stored in the capacitor $C_D$ of the dummy cell $DC_1$ by the precharge signal $\overline{CE_3}$. Herein, the capacitance of the capacitor $C_D$ is approximately a half of the capacitance of the capacitor $C_S$ of the memory cell. Therefore, when the dummy word line $DW_1$ has become the high voltage, the data line portion $DL_1$ is set, as shown at 213b, to the middle value (9.9 volts) between the two values 212b and 212e which the data line portion $DL_2$ can take.

Thereafter, the control signal $\phi_{PA}$ is raised to the value $V_{DD}$ as shown at 204c. The control signal $\overline{\phi_{PA}}$ is maintained at the low voltage. As a result, the pre-amplifier latch line PAL is discharged through the MOSFET $Q_{PA}$, and its voltage lowers rapidly to the low level (approximately zero volt). In consequence, the amplification of the pre-amplifier PA is started.

When the stored signal of the memory cell $MC_{63}$ is "1", the voltage of the data line portion $DL_2$ is as shown at 212b immediately before the starting of the amplification by the pre-amplifier PA, and this potential is higher than the voltage 213b of the data line portion $DL_1$. Upon the operation of the pre-amplifier PA, therefore, the voltage of the data line portion $DL_1$ is rapidly lowered as indicated at 213f, while the voltage of the data line portion $DL_2$ is held at a voltage 212c being very slightly lower than the potential 212b.

When the stored signal of the memory cell $MC_{63}$ is "0," the potential of the data line part $DL_2$ is lower than the potential 213b of the data line part $DL_1$ as indicated at 212f immediately before the starting of the amplification by the pre-amplifier PA. Upon the operation of the pre-amplifier, accordingly, the potential of the data line part $DL_2$ lowers rapidly as shown at 212g, and the potential of the data line part $DL_1$ becomes very slightly lower than the level 213b as shown at 213c.

In this manner, the difference between the voltages of the data line parts $DL_1$ and $DL_2$ is increased to some extent by the pre-amplifier PA. Thereafter, while the signal $\overline{\phi_{y1}}$ impressed on the MOSFET $\overline{Q_{y1}}$ is kept at the zero volt, the signal $\phi_{y1}$ impressed on the MOSFET $Q_{y1}$ is changed to the high level ($V_{DD}$) as indicated at 206c so as to connect the data line portion $DL_2$ and the common input line CIL. In this case, all the MOSFET's $Q_{y1}$ and $\overline{Q_{y1}}$ connected to the other data lines are held "off". That is, among the MOSFET's $Q_{y1}$ and $\overline{Q_{y1}}$ connected to all the data line parts, only the MOSFET $Q_{y1}$ connected to the particular data line part to which the memory cell to be read out is connected is turned "on." To this end, there is used a circuit (not shown) which brings only the signal $\phi_{y1}$ impressed on the MOSFET $Q_{y1}$ to be turned "on," into the high voltage on the basis of the address signal at the "read" of the memory cell.

The common input lines CIL and $\overline{CIL}$ are held precharged to the high voltage $V_{DD}$ as shown at 216a and 218a respectively until the control signal $\phi_{y1}$ becomes the high voltage. However, when the MOSFET $Q_{y1}$ has been turned "on" by the signal $\phi_{y1}$ and the data line portion $DL_2$ has been connected to the common input line CIL, the voltage of the common input line CIL lowers if the voltage of the data line part $DL_2$ has become lower than the precharge voltage ($V_{DD}$) of the common input line CIL. That is, the voltage after the connection, becomes one shown at 216b or 216f, depending on whether the voltage of the data line portion $DL_2$ before the connection was that shown at 212c or 212g. At this time, the voltage of the data line portion $DL_2$ becomes as shown at 212d or 212h.

On the other hand, in tune with changing the control signal $\phi_{y1}$ to the high level, the control signal $\overline{\phi_{D3}}$ impressed on the dummy cell $\overline{DC_3}$ is changed to the high voltage. The control signal $\overline{\phi_{D3}}$ is held at the low voltage. As shown at 218b, the dummy cell $\overline{DC_3}$ lowers the voltage of the common input line $\overline{CIL}$ from the original precharge voltage $V_{DD}$ indicated at 218a to a voltage lying substantially middle between the two voltages 216b and 216c which the common input line CIL can take. Of course, the signal $\overline{\phi_{D3}}$ of the high level need not be applied simultaneously with the establishment of the high level of the signal $\phi_{y1}$, but it may be applied sufficiently before the signal $\phi_{OA}$ to be stated below becomes a high voltage.

After applying the signal $\overline{\phi_{D3}}$ of the high voltage, the signal $\phi_{OA}$ is changed to the high voltage. Then, the latch node OAL is rapidly discharged through the MOSFET $Q_{OA}$, and its voltage is lowered to the low level (zero volt). As a result, the input line CIL and the data line $DL_2$ connected thereto change as shown at 216c or 216g and at 212d or 212h in correspondence with whether the stored signal of the memory cell $MC_{63}$ is logic "1" or "0," respectively.

Likewise, the input line $\overline{CIL}$ changes as shown at 218c or 218f in correspondence with whether the stored signal of the memory cell $MC_{63}$ is logic "1" or "0". The data line part $\overline{DL_1}$ changes as shown at 213f or 213c.

As the result of the above, the different voltages corresponding to the stored signal of the memory cell MC appear on the common input lines CIL and $\overline{CIL}$. At this time, the voltage of the data line portion $DL_2$ finally becomes approximately 8 volts or zero volt, depending on whether the stored signal of the memory cell $MC_{63}$ is "1" or "0." The word line $W_{63}$ is still held at the high level, so that the signal of the high level or low level is stored into the memory cell $MC_{63}$ in correspondence with the original stored signal.

After reading out the signal from the memory cell in the manner described above, all the voltages of the word line $W_{63}$ as well as dummy word line $DW_1$, and the control signals $\phi_{PA}$, $\phi_{y1}$, $\overline{\phi_{D3}}$ and $\phi_{OA}$ are made the low voltages as indicated at 202e, 204e, 206e, 208e and 210e, respectively. On the other hand, the precharge signals $\overline{CE_1}$ as well as $\overline{CE_2}$ and $\overline{CE_3}$ are made the original high voltages as indicated at 200e and 201e, respectively. As a result, the data line portions $DL_2$ and $DL_1$ and the common input lines $\overline{CIL}$ and CIL are precharged to the original levels $V_{DD}$ as shown at 212e or 212i, 213h or 213e, 218e or 218g, 216e or 216h, respectively.

The above description has been made of the memory cell connected to the data line part $DL_2$. Regarding any memory cell connected to the data line portion $DL_1$, the control signals are quite the same.

In reading out any memory cell connected to the data line part $\overline{DL_1}$ or $\overline{DL_2}$, the control signals $\overline{\phi_{PA}}$, $\phi_{D3}$ and $\overline{\phi_y}$ may be changed to high voltages instead of changing those $\phi_{PA}$, $\overline{\phi_{D3}}$ and $\phi_y$ to the high voltages.

In order to externally write a new signal into the memory cell, a method described in U.S. Pat. application Ser. No. 831,138 previously cited is relied on.

By way of example, in order to externally write a new signal into the memory cell $MC_{63}$ connected to the date line portion $DL_2$, the steps of procedure for reading out the stored signal from the memory cell $MC_{63}$ are successively executed to finally operate the main amplifier OA, whereupon the levels of only the following signals are changed without changing the levels of the other signals. That is, the signal $\phi_{RW}$ is changed to the low level to turn "off" the MOSFET's $Q_R$ and $\overline{Q_R}$. Under this state, the signal WE is changed to a high level (10 volts), and a voltage $\overline{D_i}$ of a high level ($V_{DD}$) or a low level (zero volt) is applied to the drain of a MOSFET $\overline{Q_W}$ in correspondence with whether the signal to be written is logic "1" or "0". Simultaneously, a voltage $D_i$ of the low or high level is applied to the drain of a MOSFET $Q_W$ in correspondecne with whether the signal to be written is logic "1" or "0". Further, under this state, the signal $\phi_j$ is made the high level (approximately 10 volts) to turn "on" the MOSFET $Q_{20}$, whereby the voltage of the data line portion $DL_1$ is lowered to a sufficiently low level. After the signal $\phi_j$ is subsequently returned to the low level, the signal $\phi_i$ is changed to the high level (approximately 10 volts). Quite the same applies to any memory cell connected to the data line part $DL_1$.

In writing a new singal into any memory cell connected to the data line $\overline{DL}$, the signals $\overline{\phi_i}$ and $\overline{\phi_j}$ are changed to the high level instead of changing those $\phi_i$ and $\phi_j$ to the high level. Thereafter, the signals except $\overline{CE_1}$, $\overline{CE_2}$ and $\overline{CE_3}$ are changed to the low level and then the signals $\overline{CE_1}$, $\overline{CE_2}$, $\overline{CE_3}$ are returned to the high level.

Although, in the above, description has been made of the case of turning "on" either of the pair of MOSFET's $Q_{y1}$ and $\overline{Q_{y1}}$, this invention is also effective in case of turning "on" both the MOSFET's at the same time. In this case, no "read" signal is provided to the data line portions belonging to the data line $\overline{DL}$, and the signal $\overline{\phi_{PA}}$ is "off". Therefore, even when the MOSFET $\overline{Q_{y1}}$ is turned "on", the precharge voltage of the data line portion $\overline{DL_1}$ is transmitted to the common input line $\overline{CIL}$, and hence, the line $\overline{CIL}$ remains at the precharge voltage. By raising the level of the signal $\overline{\phi_{D3}}$ and reading out the dummy cell $\overline{DC_3}$ under this state, the voltage of the line $\overline{CIL}$ lowers. When the voltage having lowered is used as the reference voltage, the operation becomes quite the same as in the foregoing case, and therefore, no further explanation is made.

Although, in the previous description, the voltages $V_{P1}$ and $V_{DD}$ have been made equal and the signal $\overline{CE_1}$ has been made the voltage sufficiently higher than $V_{DD}$, this invention is also effective for any other value of the signal $\overline{CE_1}$. By way of example, it is possible to make the voltages $\overline{CE_1}$ and $V_{DD}$ equal.

Figure 5A:
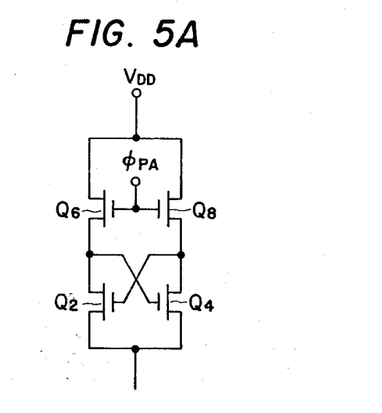
FIGS. 5A and 5B are circuit diagrams of a pre-amplifier and a main amplifier for use in another embodiment of this invention, respectively.
Figure 5B:
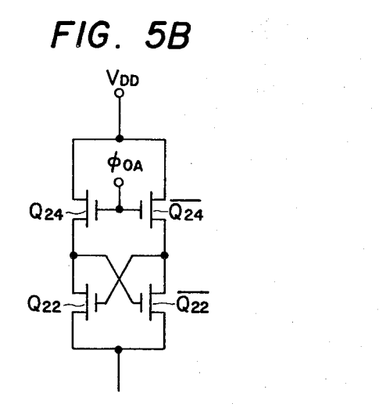

In the foregoing embodiment, both the data lines and the common input lines are charged to the voltage $V_{DD}$, and thereafter, in detecting a memory cell signal, the data line voltages are discharged according to the memory cell signal. This invention, however, is also applicable to a case where the information of a memory cell is detected by charging and discharging the voltages of the data lines. By way of example, this invention can also be applied to a case where both the voltages $V_{P1}$ and $V_{P2}$ in FIG. 1 are made $\frac{1}{2} V_{DD}$ and where all the precharge voltages $\overline{CE_1}$, $\overline{CE_2}$ and $\overline{CE_3}$ are made $V_{DD}$. In this case, as the pre-amplifier PA there is employed a static flip-flop wherein load MOSFET's $Q_6$ and $Q_8$ whose gates have the control signal $\phi_{PA}$ impressed thereon and whose drains have the voltage $V_{DD}$ impressed thereon are additionally provided as shown in FIG. 5A. The same applies to the pre-amplifier $\overline{PA}$. As the main amplifier OA, there is employed a static flip-flop wherein load MOSFET's $Q_{24}$ and $\overline{Q_{24}}$ whose gates have the control signal $\phi_{OA}$ impressed thereon and whose drains have the voltage $V_{DD}$ impressed thereon are additionally provided as shown in FIG. 5B. At this time, the capacitance $C_D$ of the dummy cell connected to the data line is selected to be lower than approximately (1/10) of the capacitance $C_S$ of the memory cell. Further, the capacitance $C_{DD}$ of the dummy cell connected to the common input line is the same as in the embodiment of FIG. 1. The timing of impressing the control signals employed is the same as in FIG. 4.

Assuming by way of example that the memory cell MC$_{63}$ has been read out, the potential of the data line part DL$_2$ becomes higher or lower than the precharge voltage $\frac{1}{2} V_{DD}$ in correspondence with the stored signal of the memory cell MC$_{63}$. On the other hand, the voltage of the data line portion DL$_1$ remains at the original precharge voltage $\frac{1}{2} V_{DD}$. When the signal $\phi_{PA}$ is thereafter changed to the high level, the data line portion DL$_2$ becomes still higher or lower than the original precharge voltage $\frac{1}{2} V_{DD}$ according to whether the stored signal of the memory cell MC$_{63}$ is "1" or "0", by the action of the pre-amplifier PA. The pre-amplifier PA, however, operates more slowly at the time of raising the voltage of the data line part than at the time of lowering it. Accordingly, the middle value of the voltages of the data line parts DL$_1$ and DL$_2$ is somewhat smaller than $\frac{1}{2} V_{DD}$ halfway in the amplification by the pre-amplifier PA. Therefore, when the common input line CIL precharged to the voltage $\frac{1}{2} V_{DD}$ is connected to the data line portion DL$_2$ through the MOSFET Q$_{y1}$ under such a state, the voltage of the line CIL changes to either of a first voltage higher than $\frac{1}{2} V_{DD}$ and a second voltage lower than it in correspondence with the stored signal of the memory cell MC$_{63}$. The middle value between the first and second voltages is somewhat smaller than $\frac{1}{2} V_{DD}$. Accordingly, by raising level of the signal $\overline{\phi_{D3}}$ to connect the dummy cell $\overline{DC_3}$ to the common input line $\overline{CIL}$, the voltage of the line $\overline{CIL}$ is set at the value substantially middle between the first and second voltages, the middle voltage being used as a reference voltage. Thus, the differences of the voltages of the common input line CIL from the voltage of the common input line $\overline{CIL}$ become substantially equal in both the cases where the stored signal of the memory cell MC$_{63}$ is logic "1" and "0". As the result, the difference between the reference voltage on the line $\overline{CIL}$ and the signal voltage on the line CIL at the time when the stored information is "1" becomes greater than in case of employing no dummy cell. Accordingly, the timing of starting the amplification by the main amplifier OA can be quickened to that extent, so that the signal of the memory cell can be transmitted to the external circuit faster.

Figure 6:
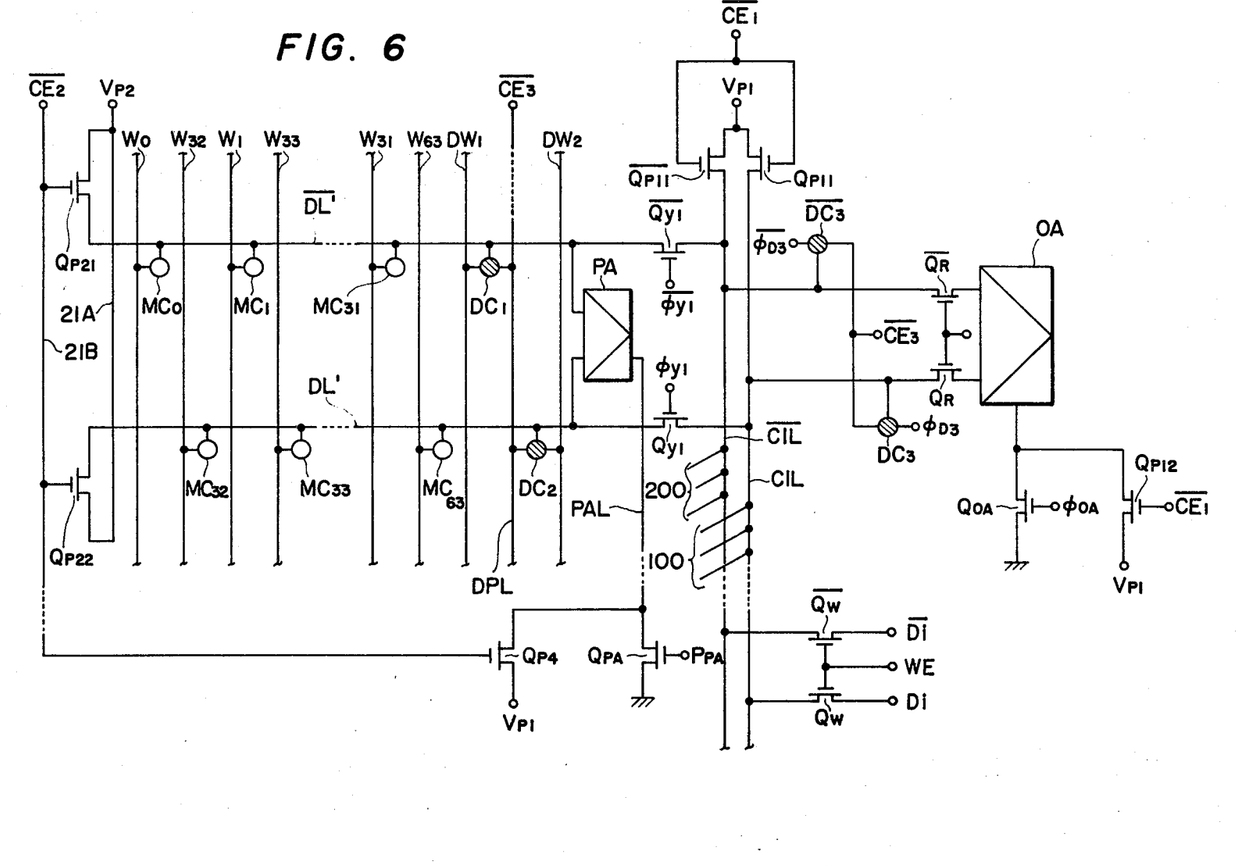
FIG. 6 is a schematic circuit diagram of another memory system according to this invention.

FIG. 6 shows another embodiment of this invention, in which the invention is applied to a memory system disclosed in U.S. Pat. No. 4,044,340. The patent has been issued to the same applicant and assigned to the same assignee as those of the present application. In FIG. 6, the same symbols as in FIG. 1 designate the same elements and control signals as in FIG. 1.

In this embodiment, a pair of data lines DL' and $\overline{DL'}$ are arranged in parallel and in adjacency to each other, and the memory cells MC$_0$–MC$_{63}$ are arranged in such a manner that one memory cell lies at either of two intersecting points between these data lines and each of the word lines W$_0$–W$_{63}$. The data lines DL' and $\overline{DL'}$ substantially correspond to the data line parts DL$_2$ and DL$_1$ in FIG. 1, respectively. The circuit of FIG. 6 does not have the right half of the circuit of FIG. 1. The data line $\overline{DL'}$ is connected to the common input line $\overline{CIL}$ through the MOSFET $\overline{Q_{y1}}$. This MOSFET $\overline{Q_{y1}}$ and the MOSFET Q$_{y1}$ are respectively controlled by the signals $\overline{\phi_{y1}}$ and $\phi_{y1}$. In the embodiment of FIG. 6, one dummy cell precharge line DPL is used instead of the two dummy cell precharge lines DPL$_1$ and DPL$_2$ in FIG. 1.

The above points are the differences relevant to this invention between the memory systems of FIG. 6 and FIG. 1. Accordingly, the description made with reference to FIG. 1 applies to FIG. 6 without any essential change, and no detailed explanation is made. With the memory system of the present embodiment, noises are canceled, so that signals can be detected with reduced noises and at high speed. In the present embodiment, when a data is to be written into the memory cell, both the signals $\phi_{y1}$ and $\overline{\phi_{y1}}$ may be rendered the high level, and the MOSFET's Q$_{10}$, Q$_{20}$, $\overline{Q_{10}}$ and $\overline{Q_{20}}$ in FIG. 1 are not required.

Figure 7:
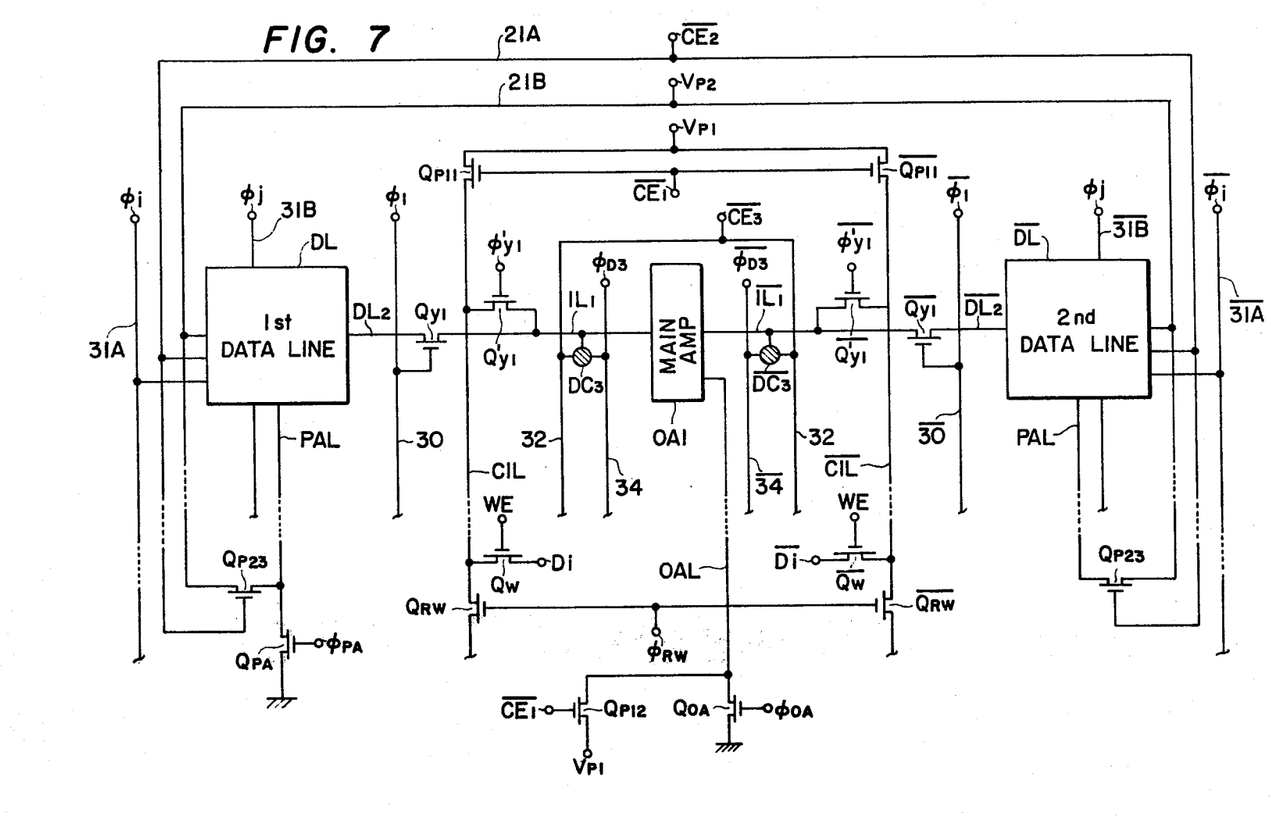
FIG. 7 is a schematic circuit diagram of still another memory system according to this invention.

FIG. 7 shows still another embodiment of this invention.

In the memory system of FIG. 7, main amplifiers are disposed separately for the respective pairs of data lines. That is, one main amplifier OA1 is disposed for the first data line DL in FIG. 1 comprising the data line portions DL$_1$ and DL$_2$, the pre-amplifier PA, the plurality of memory cells, the dummy cells and the precharging MOSFET's, and the second data line $\overline{DL}$ in FIG. 1 comprising the data line portions $\overline{DL_1}$ and $\overline{DL_2}$, the pre-amplifier $\overline{PA}$, the memory cells, the dummy cells and the precharging MOSFET's. The main amplifier OA1 has the same structure as that OA in FIG. 1. The first data line DL is connected by the MOSFET Q$_{y1}$ with a first input line part IL$_1$ which is connected to one input node of the main amplifier OA1. The second data line $\overline{DL}$ is connected by the MOSFET $\overline{Q_{y1}}$ with a second input line part $\overline{IL_1}$ which is connected to the other input node of the main amplifier OA1. The dummy cells DC$_3$ and $\overline{DC_3}$ featuring this invention are respectively connected to the first and second input line portions. The dummy cells DC$_3$ and $\overline{DC_3}$ have the same structure as in FIG. 1. The first and second input line parts IL$_1$ and $\overline{IL_1}$ are connected to the first and second common input lines CIL and $\overline{CIL}$ by MOSFET's Q'$_{y1}$ and $\overline{Q'_{y1}}$, respectively. The common input lines CIL and $\overline{CIL}$ have the precharging MOSFET's Q$_{P11}$ and $\overline{Q_{P11}}$ connected thereto and are precharged to the voltage V$_{DD}$ at the time of precharge. The precharge signal $\overline{CE_1}$ is impressed on the gates of these MOSFET's, and the voltage V$_{P1}$ is impressed on the drains thereof. Although only one set consisting of the pair of data lines DL and $\overline{DL}$ and the circuit elements connected thereto is illustrated in FIG. 7, a plurality of sets each having quite the same construction are actually arrayed in the present memory system. The word lines and the dummy word lines which intersect with the data lines are the same as in FIG. 1, and are omitted from the drawing for the sake of simplicity.

Signals $\phi_1$ and $\overline{\phi_1}$ for turning "on" and "off" the MOSFET's Q$_{y1}$ and $\overline{Q_{y1}}$ are also impressed on the MOSFET's of the other data lines through lines 30 and $\overline{30}$, respectively. Similarly, the common input lines CIL and $\overline{CIL}$ are connected with input line portions for the other data lines through MOSFET's. The signal $\overline{CE_3}$ for providing the predetermined voltage on the dummy cells DC$_3$ and $\overline{DC_3}$ is also impressed on the dummy cells of the other data lines through a line 32. Likewise, the signals $\phi_{D3}$ and $\overline{\phi_{D3}}$ for connecting the dummy cells DC$_3$ and $\overline{DC_3}$ to the input line portions IL$_1$ and $\overline{IL_1}$ are impressed on the dummy cells of the other data lines through lines 34 and $\overline{34}$, respectively. The latch nodes of the main amplifiers OA1 disposed in correspondence with the respective data lines are connected in common to the latch line OAL. The MOSFET's Q$_{OA}$ and Q$_{P12}$ are connected to this latch line. The remaining circuit elements of the same symbols as in FIG. 1 have quite the same structures and functions as in FIG. 1, and the remaining signals of the same symbols have the same signal waveforms as those in FIG. 1.

In the embodiment of FIG. 7, a signal read out from the memory cell connected with the data line DL or $\overline{DL}$ is transferred from the data line portion DL$_2$ or $\overline{DL}$ through the MOSFET Q$_{y1}$ or $\overline{Q_{y1}}$ into the input line portions IL$_1$ or $\overline{IL_1}$. The input line portions IL$_1$ or $\overline{IL_1}$ enters the signal fed from the memory cell, into the main amplifier OA$_1$.

In this case, both the MOSFET's Q$_{y1}$ and $\overline{Q_{y1}}$ are turned "on" by the signals $\phi_1$ and $\overline{\phi_1}$. Just as the MOSFET's Q$_{y1}$ and $\overline{Q_{y1}}$ in FIG. 1 couple the respective data line portions DL$_2$ and $\overline{DL_1}$ to the common input lines CIL and $\overline{CIL}$, the MOSFET's Q$_{y1}$ and $\overline{Q_{y1}}$ in FIG. 7 serve to connect the respective data line portions DL$_2$ and $\overline{DL}$ to the input lines portions IL$_1$ and $\overline{IL_1}$. Whereas the signals $\phi_{y1}$ and $\overline{\phi_{y1}}$ in FIG. 1 are impressed on the respective MOSFET's Q$_{y1}$ and $\overline{Q_{y1}}$ independently, the signals $\phi_1$ and $\overline{\phi_1}$ in FIG. 7 are impressed on the respective MOSFET's Q$_{y1}$ and $\overline{Q_{y1}}$ connected to the data line portions at the same time. Further, the signals $\phi_1$ and $\overline{\phi_1}$ in FIG. 7 become the high level at the time when the signals $\phi_{y1}$ and $\overline{\phi_{y1}}$ in FIG. 1 become the high level, but they continue to hold the high level even after the time when the signals $\phi_{y1}$ and $\overline{\phi_{y1}}$ in FIG. 1 become the low level and they become the low level simultaneously at the time when the precharge signals $\overline{CE_1}$, $\overline{CE_2}$ and $\overline{CE_3}$ become the low level. Accordingly, during the precharge period, both the MOSFET's Q$_{y1}$ and $\overline{Q_{y1}}$ are in the "on" state, and at the time when the respective data line portions DL$_2$ and $\overline{DL_1}$ are precharged by the precharging MOSFET's Q$_{P22}$ and $\overline{Q_{P21}}$ (in FIG. 1), the respective input line portions IL$_1$ and $\overline{IL_1}$ are precharged to a first predetermined precharge voltage through the MOSFET's Q$_{y1}$ and $\overline{Q_{y1}}$. In order to precharge the input line portions IL$_1$ and $\overline{IL_1}$ to the value V$_{DD}$, the high level of the signals $\phi_1$ and $\overline{\phi_1}$ is set to be sufficiently higher than the voltage V$_{DD}$, for example, at 14 volts when the voltage V$_{DD}$ is 10 volts. Of course, the high level of the signals $\phi_1$ and $\overline{\phi_1}$ may be equal to V$_{DD}$. In this case, the input line portions IL$_1$ and $\overline{IL_1}$ are precharged to a level somewhat lower than V$_{DD}$.

Signals $\phi'_{y1}$ and $\overline{\phi'_{y1}}$ impressed on the MOSFET's Q'$_{y1}$ and $\overline{Q'_{y1}}$ as feature the present embodiment are set to the high level (V$_{DD}$) upon lapse of a short time after the signal $\phi_{OA}$ has become the high level. In this case, only the signals $\phi'_{y1}$ and $\overline{\phi'_{y1}}$ impressed on the respective MOSFET's Q'$_{y1}$ and $\overline{Q'_{y1}}$ corresponding with the data line to which the memory cell to have the signal read out is connected and with the data line which pairs with the first-mentioned data line are changed to the high level, and the other signals $\phi'_{y1}$ and $\overline{\phi'_{y1}}$ are held at the low level. In this way, only the pair of MOSFET's Q'$_{y1}$ and $\overline{Q'_{y1}}$ are turned "on", and the voltages of the input line portions IL$_1$ and $\overline{IL_1}$ are respectively entered into the common input lines CIL and $\overline{CIL}$. As a result, the amplified signal of the stored signal of the memory cell is provided to the common input line CIL or $\overline{CIL}$ and is externally transmitted through a MOSFET Q$_{RW}$ or $\overline{Q_{RW}}$. Thereafter, the signals $\phi'_{y1}$ and $\overline{\phi'_{y1}}$ shift to the low level (zero volt) at the time when the signal $\phi_{OA}$ becomes the low level, and they continue to hold the low level.

Also in the embodiment of FIG. 7, the dummy cells DC$_3$ and $\overline{DC_3}$ function to lower the precharged voltage of one input line portion so as to become a substantially middle value between the two voltage values which the other input line portion can take when the signal from the memory cell has been received.

In order to write a signal into a memory cell anew, the same operation as the above "read" operation may be carried out for the memory cell into which the signal is to be written, whereupon the same control as in the "write" into the memory cell in FIG. 1 may be carried out before making the precharge signals $\overline{CE_1}$, $\overline{CE_2}$ and $\overline{CE_3}$ the high level.

Although, in the foregoing memory system, a large number of main amplifiers are required, signals can be detected at high speed to that extent.

Although, in the above embodiment, the signal $\overline{\phi_1}$ has been made the high level simultaneously with the signal $\phi_1$, it is also effective to put into the high level only one of the signals $\phi_1$ and $\overline{\phi_1}$, that is, only either the signal $\phi_1$ or $\overline{\phi_1}$ for the MOSFET Q$_{y1}$ or $\overline{Q_{y1}}$ connected with the data line with which the memory cell to be read out is connected, and to hold the other signal at the low level. In this case, the power consumption lowers to that extent.

As set forth above, this invention, akes it possible to detect memory cell signals at high speed. Although this invention has been described along the preferred embodiments, it is not restricted thereto but it shall cover various modifications which those in the art can perform within the scope of this invention as defined in the appended claims. For example, as the differential detection means in this invention, various known ones can be employed besides the differential amplifiers described and illustrated in the specification and the accompanying drawings.

What is claimed is:

1. A memory system comprising:
   a plurality of pairs of first and second data lines,
   a plurality of word lines which are disposed in a manner to intersect with said plurality of pairs of data lines,
   a plurality of memory cells for storing either of two different signals, each of which is disposed at a point of intersection of respective one of said plurality of pairs of data lines and respective one of said plurality of word lines, is connected to said respective data line and said respective word line, and generates either of two different voltage signals corresponding to the stored signals onto said respective one data line in response to a signal on said respective one word line,
   first and second input line means,
   the same number of pairs of first and second switching means as that of the pairs of said data lines, for connecting said first and second data lines of each pair of said first and second input line means, respectively,
   differential detection means connected to said first and second input line means and for detecting a voltage difference between said first and second input line means,
   first and second precharge means connected to said first and second input line means and for providing a predetermined first precharge voltage on said first and second input line means, respectively, and
   first and second dummy cell means connected to said first and second input line means and for shifting on a selective basis the voltages of said first and second input line means before said differential detection means is enabled from said first precharge voltage to a voltage lying between two voltages which said second and first input line means can take in response to said different signals from one of said memory cells, respectively.

2. A memory system according to claim 1, wherein:
   said first and second dummy cell means are means for lowering said voltages of said first and second input line means by a predetermined amount from said first precharge voltage, respectively; and
   said differential detection means is means for further lowering the voltage of that one of said first and second input line means which has the lower voltage, while substantially holding the voltage of the other input line means which has the higher voltage.

3. A memory system according to claim 1, wherein:
   said first and second dummy cell means are means for lowering said voltages of said first and second input line means by a predetermined amount from said first precharge voltage, respectively; and
   said differential detection means is means for further raising the voltage of that one of said first and second input line means which has the higher voltage and for further lowering the voltage of the other input line means which has the lower voltage.

4. A memory system according to claim 1, wherein:
   a plurality of pairs of third and fourth precharge means connected to said plurality of pairs of first and second data lines and for providing a predetermined second precharge voltage on said data lines before reading out the stored signals from one of said memory cells, respectively, are disposed; and
   each of said memory cells is a memory cell which, at the "read" of the stored signals, shifts the voltage of said data line with said memory cell connected thereto by amounts dependent upon the stored signals from said second precharge voltage.

5. A memory system according to claim 1, wherein:
   said first and second input line means are comprised of first and second common input lines connected to said plurality of first and second switching means, respectively; and
   said differential detection means is a common differential detector whose first and second input terminals are respectively connected to said first and second common input lines and which detects a voltage difference between said first and second common input lines.

6. A memory system according to claim 5, wherein:
   said first and second precharge means are precharge means for providing said predetermined first precharge voltage on said first and second common input lines respectively before at least one of said plurality of pairs of first and second switching means is turned "on;" and
   said first and second dummy cell means are first and second dummy cells connected to said first and second common input lines and for shifting the voltages of said first and second common input lines by a predetermined amount from said first precharge voltage, respectively.

7. A memory system according to claim 6, wherein each of said first and second dummy cells comprises
   a capacitor;
   switching means for connecting said capacitor to the corresponding one of said first and second common input lines; and
   means for providing a predetermined voltage to said capacitor.

8. A memory system according to claim 5, wherein said plurality of pairs of first and second switching means are switching means among which only one for connecting the corresponding input line means to the data line with which the memory cell to have the signal read out is connected is turned "on" after the "read" of the stored signals, and among which all the others are held "off."

9. A memory system according to claim 5, wherein said plurality of pairs of first and second switching means are switching means among which first and second switching means for connecting said first and second common input lines to that one pair of a first and a second data lines of said plurality of pairs of first and second data lines with either one of which the memory cell to have the stored signals read out is connected are turned "on," and among which all the other pairs of first and second switching means are held "off."

10. A memory system according to claim 5, further comprising first and second signal input means connected to said first and second common input lines and for providing one of first and second signals to one of said first and second common input lines in correspondence with a signal to be written, respectively.

11. A memory system according to claim 10, further comprising third and fourth switching means respectively interposed in said first and second common input lines at positions intervening respectively between respective connecting points of said first and second signal input means and said first and second common input lines and respective connecting points of said differential detection means and said first and second common input lines, both said third and fourth switching means being turned "on" when a signal is read out from one of said memory cells and being turned "off" when a signal is written into one of said memory cells.

12. A memory system according to claim 1, wherein:
said differential detection means is made up of the same number of didferential detectors as that of the pairs of said data lines; and
said first and second input line means have the same number of pairs of first and second input line portions as that of said differential detectors, respectively, one end of each of the pairing first and second input line portions being connected to the corresponding one of the pairing first and second switching means and the other end thereof being connected to an input terminal of the corresponding differential detector.

13. A memory system according to claim 12, wherein:
said first and second precharge means are means for providing said predetermined first precharge voltage on the plurality of pairs of first and second input line portions respectively before connecting one of said data lines and corresponding one of said input line portions by corresponding one of said first and second switching means; and
said dummy cell means are comprised of a plurality of pairs of first and second dummy cells, each being connected to said first and second input line portions of the corresponding pairs, respectively, and for shifting the voltages of said first and second input line portions by a predetermined amount from said first precharge voltage.

14. A memory system according to claim 13, wherein each of said first and second dummy cells comprises:
a capacitor;
switching means for connecting said capacitor to the corresponding one of said first and second common input lines; and
means for supplying a predetermined voltage to said capacitor.

15. A memory system according to claim 12, wherein said first and second input line means further include:
first and second common input lines; and
a plurality of pairs of third and fourth switching means for connecting said first and second common input lines to said plurality of pairs of first and second input line portions, respectively.

16. A memory system according to claim 15, wherein said first and second precharge means are means connected to said first and second data lines, respectively, and for providing said predetermined first precharge voltage on said first and second data lines and said first and second input line portions connected to the respective data lines under the state under which all said plurality of pairs of first and second switching means are turned "on."

17. A memory system according to claim 15, wherein: each of said differential detectors is a differential amplifier which differentially amplifies the difference of the voltages of a pair of input line portions connected thereto; and corresponding one pair of third and fourth switching means are turned "on" so that, after the amplification, said first and second common input lines are connected to said pair of input line portions.

18. A memory system according to claim 17, wherein all the plurality of pairs of first and second switching means are turned "on" simultaneously when a stored signal is read out from one of said memory cells.

19. A memory system according to claim 17, wherein either all the plurality of first switching means or all the plurality of second switching means of the plurality of pairs of first and second switching means are turned "on" simultaneously when a stored signal is read out from one of said memory cells.

20. A memory system according to claim 17, further comprising:
first and second signal input means connected to said first and second common input lines, respectively, and for providing one of first and second different voltages to one of said common input lines in correspondence with a signal to be written.

21. A memory system according to claim 20, wherein said first and second common input lines are respectively comprised of:
first and second common input line portions;
fifth switching means for connecting said common input line portions;
said first common input line portions for said first and second common input lines being connected to said plurality of first and second input line portions through said plurality of third and fourth switching means respectively; said first and second signal input means being connected to said corresponding first common input line portions respectively, and said fifth switching means being turned "on" when a signal is read out from one of said memory cells and "off" when a signal is written into one of said memory cells.

* * * * *